United States Patent [19]
Horne

[11] Patent Number: 5,920,097
[45] Date of Patent: Jul. 6, 1999

[54] COMPACT, DUAL-TRANSISTOR INTEGRATED CIRCUIT

[75] Inventor: Stephen C. Horne, Austin, Tex.

[73] Assignee: Advanced Micro Devices, Inc., Sunnyvale, Calif.

[21] Appl. No.: 08/824,323

[22] Filed: Mar. 26, 1997

[51] Int. Cl.⁶ .................................................. H01L 29/72

[52] U.S. Cl. ........................... 257/368; 257/67; 257/382; 257/393; 257/401; 257/412; 438/149; 438/213; 438/279

[58] Field of Search ............................... 257/67, 368, 382, 257/393, 401, 412; 438/149, 213, 279

[56] References Cited

U.S. PATENT DOCUMENTS 5,350,932   9/1994   Malhi ........................................ 257/67

*Primary Examiner*—Edward Wojciechowicz
*Attorney, Agent, or Firm*—Foley & Lardner

[57] ABSTRACT

A compact, integrated semiconductor device includes a first transistor and a second transistor. The first transistor has a gate formed by a first portion of a gate material. A second portion of the gate material provides the bulk material for a second transistor. The device can be utilized in a six-transistor SRAM cell. The two-transistor structure can include a p-channel transistor and an n-channel transistor of such a cell.

20 Claims, 3 Drawing Sheets

5,920,097

COMPACT, DUAL-TRANSISTOR INTEGRATED CIRCUIT

FIELD OF THE INVENTION

The present invention relates generally to integrated semiconductor devices and, in particular, to semiconductor memory cells in which a portion of the gate material which forms a first transistor gate is used as the bulk material for a second transistor.

BACKGROUND OF THE INVENTION

More sophisticated technology has created a heightened demand for smaller, faster semiconductor devices incorporating an ever increasing number of components. An area of special interest is semiconductor memory devices, such as a random access memory ("RAM"), having greater storage capacity.

Such memory devices typically include a number of memory cells accessed by a pass transistor coupled to at least one bit line. The memory cells often include at least one storage device coupled to a storage node. Generally, memory cells include two storage devices, such as storage transistors, each coupled to one of a pair of complementary storage nodes which are accessed by two pass transistors. Each pass transistor is further coupled to a bit line. Thus, each memory cell is often located between two complementary bit lines.

The pass transistors have gate electrodes coupled to a word line. A signal, such as an address or SELECT signal, is provided on the word line associated with the memory cell to select or access the memory cell. Once selected via the word line, the memory cell can be read or written to through the pass transistors via the bit lines.

To increase the storage capacity of such memory devices, a greater number of individual memory cells, as well as the additional components required to access the added cells, must be incorporated. Because available area within a memory device is at a premium, the physical layout of the components must become more compact and the physical dimensions of each component must be decreased to prevent the overall dimensions of the memory device from becoming excessively large.

The need to optimize the use of available physical area is especially critical in static RAM devices in which a typical memory cell includes four transistors accessed by two pass transistors coupled between a pair of complementary bit lines. Accordingly, a need exists for innovative physical layouts of individual components such that space optimization may be accomplished.

SUMMARY OF THE INVENTION

The invention provides an innovative integrated semiconductor device and a method for fabricating such a device in which a portion of the gate material which forms a first transistor gate is used as the bulk material for a second transistor. The structure allows reduction in the physical size of the semiconductor device.

Accordingly, in a first aspect of the invention, a semiconductor device includes a gate material, a first transistor having a gate formed by a first portion of the gate material, and a second transistor having source and drain regions formed in a second portion of the gate material. One of the source and drain regions of the second transistor is coupled to the gate of the first transistor.

In accordance with another aspect of the invention, an SRAM memory cell includes a first inverter, a second inverter cross-coupled to the first inverter, and a gate material having first and second portions. The first and second inverters each include a load transistor and a pull-down transistor. The first portion of the gate material forms the gate of the pull-down transistor in the first inverter. The source and drain regions of the load transistor in the second inverter are formed in the second portion of the gate material such that one of the source and drain regions is coupled to the gate of the pull-down transistor in the first inverter.

A further aspect of the invention provides a method of fabricating a semiconductor device including a first transistor having a first gate and a second transistor having a second gate and source and drain regions. The first gate is coupled to one of the source and drain regions of the second transistor. A first gate material includes a first portion which forms the first gate. Another layer is provided over a second portion of the first gate material to insulate a second gate material from the first gate material. The second gate material forms the second gate of the second transistor. Portions of the second portion of the first gate material are doped to form the second transistor source and drain regions.

BRIEF DESCRIPTION OF THE DRAWINGS

The present invention will become more fully understood from the following detailed description, taken in conjunction with the accompanying drawings, wherein like reference numerals denote like elements.

DETAILED DESCRIPTION OF THE PREFERRED EMBODIMENTS

Figure 1:
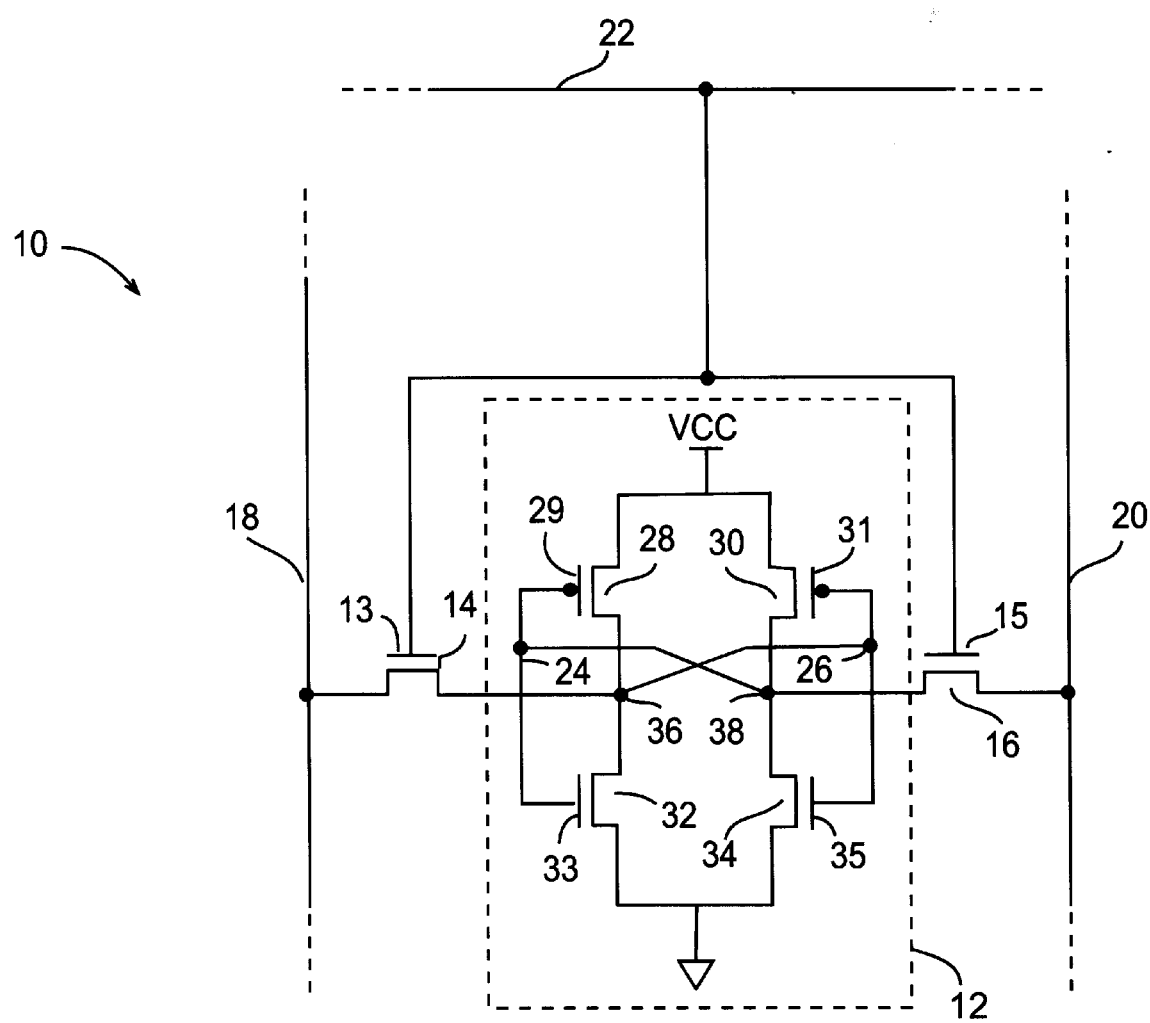
FIG. 1 is an electrical schematic diagram illustrating a portion of a typical SRAM memory device known in the prior art.

Turning now to FIG. 1, a memory unit 10 of a typical static random access memory ("SRAM") device known in the prior art is illustrated. Memory unit 10 includes a four transistor memory storage cell 12, a pair of accessor pass transistors 14, 16 to access cell 12, a pair of complementary bit lines 18, 20 to carry data to and from cell 12, and a word line 22 used to access cell 12. A typical SRAM device includes a column of memory units 10 coupled between complementary bit lines 18, 20 and a row of memory units 10 coupled to word line 22.

Memory storage cell 12 includes load transistors 28, 30 and pull-down (drive) transistors 32, 34. Transistors 28 and 32 form a first inverter having an input 24 at the junction of their gates 29, 33. Likewise, transistors 30 and 34 form a second inverter having an input 26 at the junction of their gates 31, 35. Input 24 is coupled to the output of the second inverter at a storage node 38. Similarly, input 26 is coupled to the output of the first inverter at a storage node 36. Thus, transistors 28, 30, 32 and 34 are interconnected to from cross-coupled inverters having complementary storage nodes 36, 38.

Load transistors 28, 30 preferably are p-channel transistors, but may be replaced by polysilicon or other resistors, n-channel depletion-mode transistors, or other electrical devices for pulling up the voltage at complementary storage nodes 36, 38 when pull-down transistors 32, 34 are not activated, respectively. Pull-down transistors 32, 34 preferably are n-channel enhancement-mode transistors, although other types of transistors (e.g., depletion-mode or bipolar transistors) or other devices may be utilized.

Storage node 36 is coupled to pass transistor 14 which is controlled by word line 22. Storage node 38 is coupled to pass transistor 16 which also is controlled by word line 22. Pass transistors 14, 16 preferably are n-channel enhancement-mode transistors, although other types of transistors may be used.

In operation, memory cell 12 stores complementary data bits or voltage states representative of a HIGH logic state (i.e., VCC) and a LOW logic state (i.e., ground) on complementary storage nodes 26, 28. Typically, the HIGH logic state, or VCC, has a value of either 3.3V or 5V, although values less than 3.3V are also possible. When pull-down transistor 32 is activated, load transistor 30 is turned ON and pull-down transistor 34 and load transistor 28 are turned OFF. As a result, storage node 36 is coupled to ground and storage node 38 is coupled to VCC. Likewise, when pull-down transistor 34 is activated, load transistor 28 is turned ON and pull-down transistor 32 and load transistor 30 are turned OFF. Storage node 36 is then coupled to VCC, and storage node 38 is coupled to ground. Thus, the logic state stored on node 36 is the complementary of the logic state stored on node 38.

Figure 2:
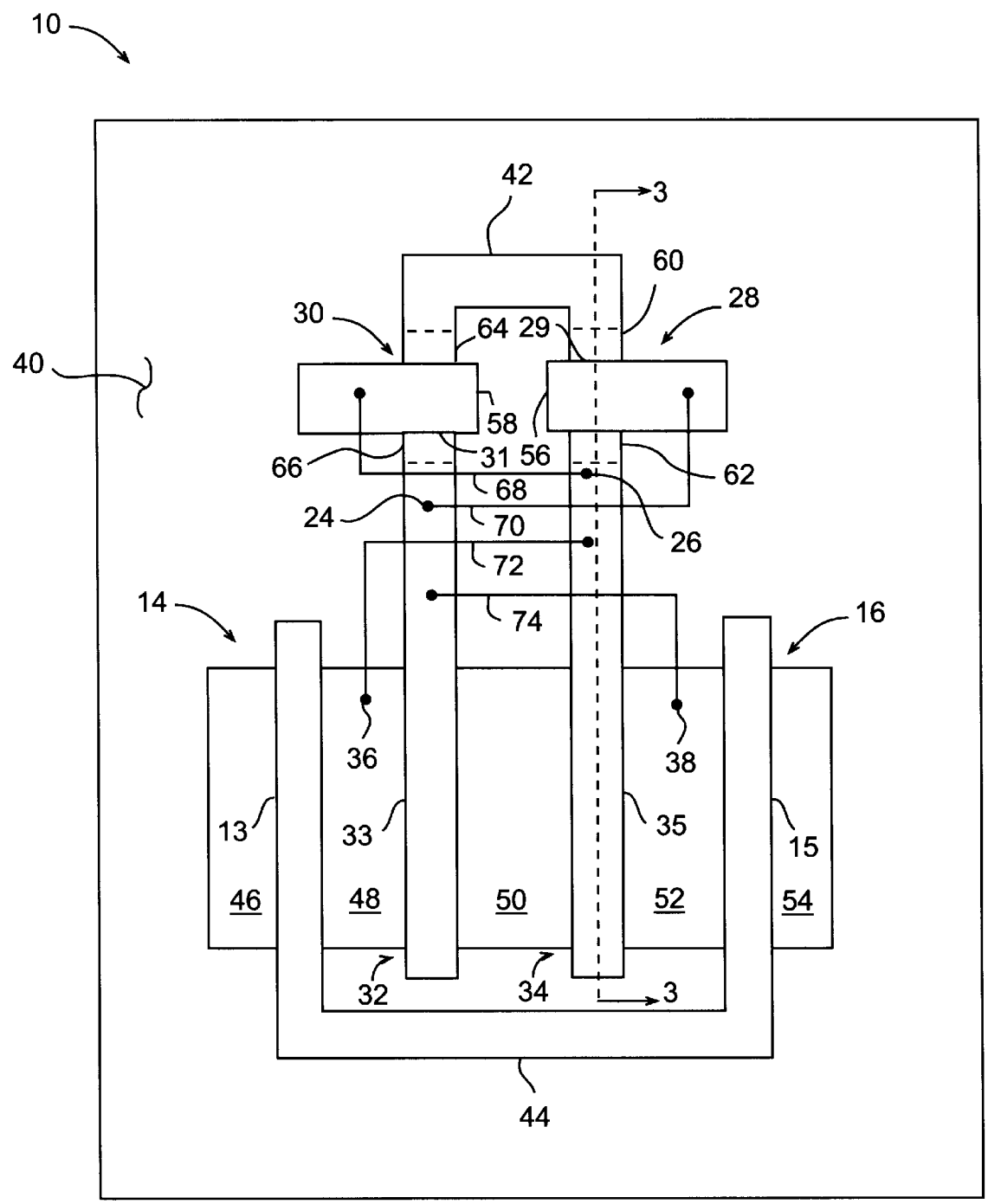
FIG. 2 is a top view schematic layout of an exemplary embodiment of the portion of the SRAM memory device of FIG. 1 in accordance with the invention.

Referring now to FIG. 2, a top view schematic of the physical layout of a preferred embodiment of memory unit 10 is illustrated. Memory unit 10 is fabricated on a portion of a semiconductor substrate 40. Substrate 40 is preferably a lightly doped p-type silicon wafer which forms the bulk material for n-channel enhancement-mode transistors 14, 16, 32 and 34. In other embodiments of the invention, substrate 40 may be doped with other type dopants as appropriate for the device fabricated. The bulk material for p-channel enhancement-mode transistors 28 and 30 is provided for by a gate material 42, as will be explained in detail below.

A gate material 44 overlies and is insulated from substrate 40, as appropriate. Gate material 44 preferably is deposited polysilicon which is heavily doped with n-type dopants, but may also be differently doped or another type of conductive material. Gate material 44 is patterned, preferably as shown in FIG. 2, such that a first portion of gate material 44 forms gates 13 and 15 of pass transistors 14 and 16, respectively, and a second portion extends past doped regions 46–54, forming a conductive line that couples gate 13 to gate 15. Doped regions 46, 48, 50, 52 and 54 are provided in substrate 40, such as by ion implantation or diffusion of n-type dopants. Regions 46 and 48 form the source/drain regions of pass transistor 14, and regions 52 and 54 form the source/drain regions of pass transistor 16.

Similarly, gate 33 of pull-down transistor 32 and gate 35 of pull-down transistor 34 are formed of gate material 42 disposed on and insulated from substrate 40, as appropriate, and doped regions 48, 50 and 52 form the source/drain regions. A portion of gate material 42 also extends past regions 45–54, providing the bulk material for load transistors 28 and 30. Gate material 42 preferably is deposited polysilicon, but may also be an amorphous semiconductor film, a single-crystal semiconductor material, or another conductive material. Gate material 42 may be heavily doped with n-type dopants except for the portion of gate material 42 that provides the bulk material for load transistors 28, 30.

A gate material 56 and a gate material 58 form gates 29 and 31 of load transistors 28 and 30, respectively. Gate materials 56 and 58 overlie and are appropriately insulated from the portion of gate material 42 that provides the bulk semiconductor material for transistors 28 and 30. Gate materials 56 and 58 preferably are deposited polysilicon, but may be another conductive material. Doped regions 60, 62, 64, and 66 are provided in gate material 42, such as by ion implantation or diffusion of p-type dopants. Regions 60, 62 form the source/drain regions of load transistor 28. Region 62 (e.g., the drain of load transistor 28) is integrally coupled to gate 35 of pull-down transistor 34. Similarly, regions 64, 66 form the source/drain regions of load transistor 30. Region 66 (e.g., the drain of load transistor 30) is integrally coupled to gate 33 of pull-down transistor 32.

The remaining interconnections which cross couple inputs 24, 26 and storage nodes 36, 38 of the two inverters are provided by conductive lines 68, 70, 72, and 74 which are formed and appropriately insulated from other conductive layers in a conventional manner. Line 68 interconnects gates 31 and 35 at input 26 of the inverter formed by load transistor 30 and pull-down transistor 34. Likewise, line 70 interconnects gates 29 and 33 at input 24 of the inverter formed by load transistor 28 and pull-down transistor 32. Line 72 cross-couples input 26 to storage node 36 and line 74 cross-couples input 24 to storage node 38. Lines 68, 70, 72, and 74 can be local interconnects, metal lines, conductive vias, or other connective structures.

Figure 3:
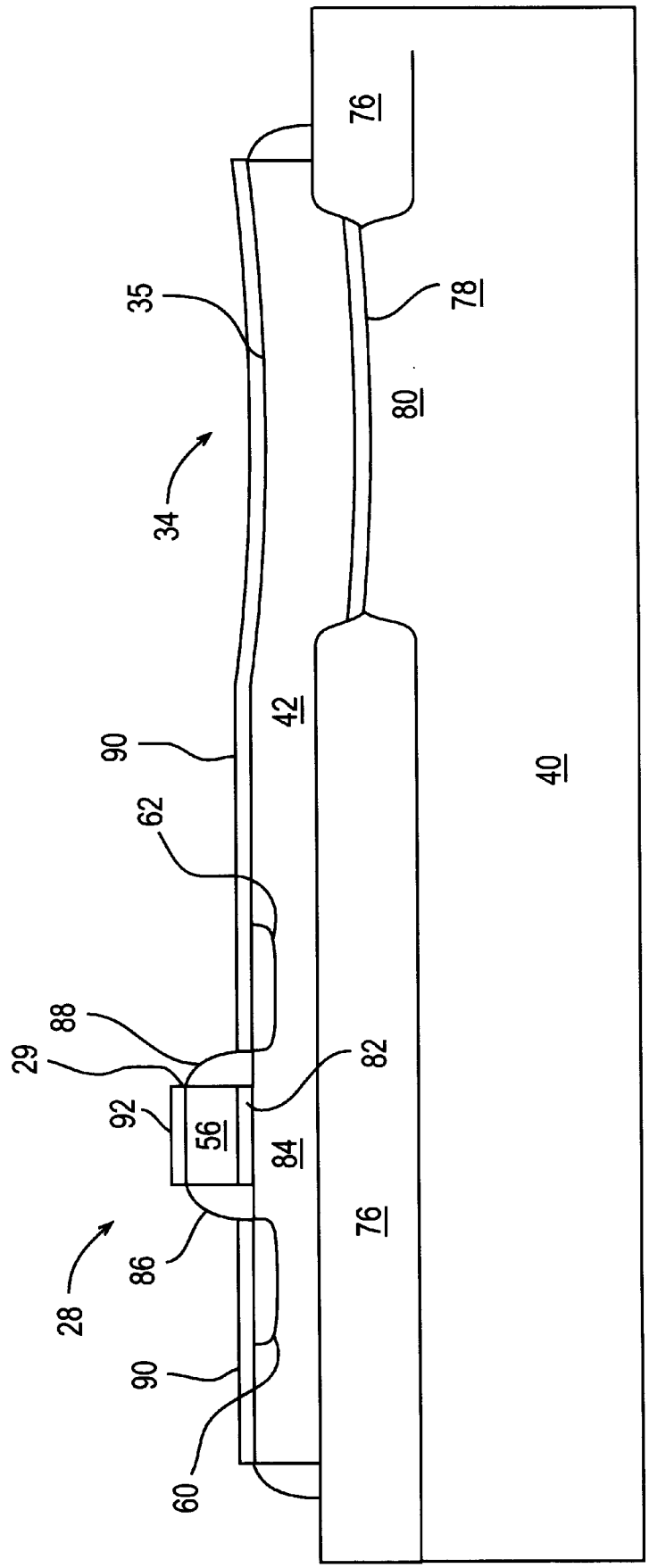
FIG. 3 is a cross-sectional view of a semiconductor substrate about line 3—3 of the portion of the memory device schematically illustrated in FIG. 2.

Referring now to FIG. 3, a cross-sectional view of memory unit 10 along line 3—3 of FIG. 2 is illustrated. In the embodiment shown, the starting material for memory unit 10 is substrate 40 which preferably is a p-type lightly doped silicon wafer, although other semiconductor materials as well as other types of dopants may be used. Substrate 40 can be prepared in accordance with conventional process techniques including placing the wafer in an oxidation furnace to grow a field oxide 76.

Next, a gate oxide 78, which insulates gate 35 of pull-down transistor 34 from substrate 40 in a channel region 80, is grown by oxidation. Typically, the threshold voltage of transistor 34 is adjusted by ion implantation in channel region 80. Next, gate 35 is formed by depositing gate material 42 in a pattern, such as illustrated in FIGS. 2 and 3, and heavily doping material 42 as appropriate. That is, the portion of gate material 42, that provides the bulk material for load transistor 28, is masked off during the heavy doping procedure such that relatively light doping is preserved in a channel region 84 and source/drain regions 60, 62.

Source/drain regions 50 and 52 (not shown in FIG. 3) are then formed by conventional techniques, such as ion implantation or diffusion of n-type dopants. Typically, another layer (e.g., oxide or nitride) is deposited over gate material 42 and then etched to leave sidewall spacers (not shown) at the edges of the portion of gate material 42 which provides gate 35. The sidewall spacers and gate material 42 serve as a mask for forming doped source/drain regions 50 and 52 such that regions 50 and 52 are self-aligned with respect to gate 35. The portion of gate material 42 which extends past source/drain regions 50 and 52 is used as the bulk material for forming load transistor 28, as will be explained next.

To form load transistor 28, a gate oxide layer 82 is first grown, such as by thermal oxidation, to insulate gate 29 from channel region 84, as illustrated in FIG. 3. The threshold voltage of transistor 28 may be adjusted by an ion implant in channel region 84. Next, gate 29 is formed by depositing and heavily doping gate material 56 in a pattern, such as that illustrated in FIGS. 2 and 3, and a layer of material, such as oxide or nitride, is deposited and etched, leaving sidewall spacers 86 and 88 on either side of gate material 56. Sidewall spacers 86 and 88 and gate material 56 serve as a mask for the subsequent alignment of source/drain regions 60 and 62 with gate 29. Source/drain regions 60, 62 are formed, for example, by ion implantation or diffusion of dopants. Silicide layers 90 and 92 (e.g., titanium silicide) are next formed over gate materials 56 and 42. Sidewall spacers 86, 88 insulate silicide layer 90 from silicide layer 92. Interconnects (not shown) and subsequent processing is then performed in accordance with conventional techniques.

While the embodiments illustrated in the FIGURES and described above are presently preferred, it should be understood that these embodiments are offered by way of example only. The invention is not intended to be limited to any particular embodiment, but is intended to extend to various modifications that nevertheless fall within the scope of the appended claims. For example, although the preferred embodiment of the invention has been described with respect to a p-channel enhancement-mode transistor fabricated in the gate material of an n-channel enhancement-mode transistor, a variation of the invention could include two n-channel transistors having appropriately doped semiconductor layers, two p-channel transistors having appropriately doped semiconductor layers, or an n-channel transistor formed in the gate material of a p-channel transistor.

What is claimed is:

1. A semiconductor device, comprising:
    a gate material overlying and insulated from a semiconductor substrate, the gate material having a first portion and a second portion integral with one another;
    a first transistor having a first gate region, a first drain region, and a first source region, the first gate region being formed in the first portion of the gate material and the first drain and first source regions being formed in the semiconductor substrate; and
    a second transistor having a second gate region, a second source region, and a second drain region, wherein the second gate region overlies and is insulated from the second portion of the gate material, and the second source and second drain regions are formed in the second portion of the gate material.

2. The semiconductor device as recited in claim 1, wherein the gate material is an amorphous material.

3. The semiconductor device as recited in claim 1, wherein the gate material is a single-crystal material.

4. The semiconductor device as recited in claim 1, wherein the gate material is doped silicon.

5. The semiconductor device as recited in claim 4, wherein the first portion of the gate material is heavily doped relative to the second portion of the gate material.

6. The semiconductor device as recited in claim 1, wherein the first and second transistors are oppositely doped.

7. The semiconductor device as recited in claim 6, wherein the first transistor is an n-channel pull-down transistor included in a first inverter, the first inverter having an input and an output, and the second transistor is a p-channel load transistor included in a second inverter, the second inverter having an input and an output cross-coupled to the output and the input of the first inverter, respectively.

8. The semiconductor device as recited in claim 1, wherein the semiconductor device is part of a memory cell fabricated on a semiconductor substrate.

9. An SRAM memory cell, comprising:
    a semiconductor substrate;
    a first inverter including a first load transistor and a first pull-down transistor, the first pull-down transistor having a first gate region, a first source region, and a first drain region, the first source and first drain regions being formed in the semiconductor substrate;
    a gate material disposed atop and insulated from the semiconductor substrate, the gate material having a first portion integral with a second portion, the first gate region of the first pull-down transistor being formed in the first portion of the gate material; and
    a second inverter cross-coupled to the first inverter, the second inverter including a second load transistor and a second pull-down transistor, the second load transistor having a second gate region, a second source region, and a second drain region, the second gate region disposed atop and insulated from the second portion of the gate material, and the second source and second drain regions formed in the second portion of the gate material.

10. The SRAM memory cell as recited in claim 9, wherein the gate material is doped silicon.

11. The SRAM memory cell as recited in claim 10, wherein the first portion of the gate material is heavily doped relative to the second portion of the gate material.

12. The SRAM memory cell as recited in claim 9, wherein the gate material is an amorphous material.

13. The SRAM memory cell as recited in claim 9, wherein the gate material is a single-crystal material.

14. The SRAM memory cell as recited in claim 9, wherein the first pull-down transistor and the second load transistor are oppositely doped.

15. The SRAM memory cell as recited in claim 9, wherein the memory cell is part of a microprocessor fabricated on a semiconductor substrate.

16. A method of fabricating a semiconductor device including a first transistor having a first gate region, a first source region, and a first drain region, and a second transistor having a second gate region, a second source region and a second drain region, the first gate region being interconnected with one of the second source and drain regions, the method comprising:
    providing a first gate material disposed atop and insulated from a semiconductor substrate, the first gate material having a first portion integral with a second portion;
    forming the first gate region in the first portion of the first gate material;
    forming the first source and first drain regions in the semiconductor substrate;
    providing an insulating layer over the second portion of the first gate material;
    providing a second gate material disposed atop the insulating layer;
    forming the second gate region in the second gate material; and
    doping portions of the second portion of the first gate material to form the second source and second drain regions of the second transistor.

17. The method as recited in claim 16, wherein the step of providing the first gate material includes heavily doping the first portion of the first gate material with an n-type dopant.

18. The method as recited in claim 16, wherein the first transistor and the second transistor are oppositely doped.

19. The method as recited in claim 16, wherein the first gate material is an amorphous material.

20. The method as recited in claim 16, wherein the semiconductor device is a portion of an SRAM memory cell.

* * * * *